(12) United States Patent
Zhang (10) Patent No.: US 12,418,385 B2
(45) Date of Patent: Sep. 16, 2025

(54) COMMUNICATION METHOD AND APPARATUS FOR CARRIER AGGREGATION

(71) Applicant: HUAWEI TECHNOLOGIES CO., LTD., Shenzhen (CN)

(72) Inventor: Qian Zhang, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 425 days.

(21) Appl. No.: 17/974,766

(22) Filed: Oct. 27, 2022

(65) Prior Publication Data

US 2023/0079322 A1 Mar. 16, 2023

Related U.S. Application Data

(63) Continuation of application No. PCT/CN2021/090168, filed on Apr. 27, 2021.

(30) Foreign Application Priority Data

Apr. 28, 2020 (CN) .......................... 202010352423.5

(51) Int. Cl.
*H04L 5/00* (2006.01)
*H04B 7/0413* (2017.01)
*H04B 7/06* (2006.01)

(52) U.S. Cl.
CPC ......... *H04L 5/0098* (2013.01); *H04B 7/0413* (2013.01); *H04B 7/0628* (2013.01)

(58) Field of Classification Search
CPC ..... H04L 5/0098; H04L 5/0023; H04L 5/001; H04L 5/0053; H04L 5/0092;
(Continued)

(56) References Cited

U.S. PATENT DOCUMENTS 11,381,959 B2 * 7/2022 Takahashi ................ H04L 5/001
2009/0046596 A1 * 2/2009 Ewe .................. H04W 36/0033
370/252

(Continued)

FOREIGN PATENT DOCUMENTS

CN 109314550 A 2/2019
CN 110011772 A 7/2019
(Continued)

OTHER PUBLICATIONS

Moderator (Qualcomm Incorporated), "Email Discussion Summary for [94e Bis][206] NR_IAB_Featurelist", 3GPP TSG-RAN WG4 Meeting # 94-e-eBis, R4-2005436, Apr. 20-30, 2020, 19 pages.
(Continued)

*Primary Examiner* — Afshawn M Towfighi
(74) *Attorney, Agent, or Firm* — Maier & Maier, PLLC (57) ABSTRACT

A method and apparatus. The method includes: a terminal device sends a carrier aggregation (CA) capability reporting message to a network device, where the CA capability reporting message includes a frequency separation class of each of at least one radio frequency (RF) channel of the terminal device and a power amplifier (PA) architecture of the terminal device. The PA architecture indicates that the PA architecture that can be used by the terminal device to (Continued)

support CA is a single PA and/or a plurality of PAs. The network device can improve CA resource configuration flexibility by using the foregoing method.

20 Claims, 4 Drawing Sheets

(58) Field of Classification Search
CPC ... H04L 5/0094; H04B 7/0413; H04B 7/0628; H03F 2200/111; H03F 2200/451; H03F 1/0277; H04W 72/51; H04W 72/044; H04W 72/21; H04W 72/23
See application file for complete search history.

(56) References Cited

U.S. PATENT DOCUMENTS

| | | | |
|---|---|---|---|
| 2009/0215446 A1* | 8/2009 | Hapsari | H04W 48/18 455/432.1 |
| 2013/0121264 A1* | 5/2013 | Heo | H04W 52/346 370/329 |
| 2016/0192350 A1* | 6/2016 | Yi | H04L 5/0035 370/329 |
| 2016/0309535 A1 | 10/2016 | Myoung et al. | |
| 2016/0323885 A1* | 11/2016 | Kazmi | H04W 76/27 |
| 2018/0206113 A1 | 7/2018 | He et al. | |
| 2018/0219652 A1 | 8/2018 | Chen et al. | |
| 2018/0279168 A1* | 9/2018 | Jheng | H04L 5/001 |
| 2019/0166586 A1 | 5/2019 | Gholmieh et al. | |
| 2019/0182898 A1* | 6/2019 | Yu | H04B 7/00 |
| 2020/0396684 A1* | 12/2020 | Lin | H04W 52/0238 |
| 2021/0153022 A1* | 5/2021 | Ohlsson | H04W 8/24 |

FOREIGN PATENT DOCUMENTS

| | | |
|---|---|---|
| CN | 110720186 A | 1/2020 |
| CN | 110741699 A | 1/2020 |
| CN | 110999177 A | 4/2020 |
| EP | 3099000 B1 | 1/2020 |
| KR | 101672356 B1 | 11/2016 |
| WO | 2015113233 A1 | 8/2015 |

OTHER PUBLICATIONS

Qualcomm Incorporated, "FR2 DL CA BW Enhancement Feature Definition", 3GPP TSG-RAN4 #92-Bis, R4-1910763, Oct. 14-18, 2019, 7 pages.
NTT Docomo, Inc., "Signalling on intra-band NC CA and MIMO capability", 3GPP TSG-RAN WG4 Meeting #86, R4-1802706, Athens, Greece, Feb. 26-Mar. 2, 2018, 2 pages.
"3rd Generation Partnership Project; Technical Specification Group Radio Access Network;NR;User Equipment (UE) radio transmission and reception; Part 1: Range 1 Standalone(Release 16)", 3GPP TS 38.101-1 V16.3.0 (Mar. 2020), 332 pages.
Huawei et al., "Signalling on intra-band NC CA separation", 3GPP TSG-RAN WG4 Meeting #86bis, R4-1804440, Melbourne, Australia, Apr. 16-20, 2018, 2 pages.
"3rd Generation Partnership Project; Technical Specification Group Radio Access Network;NR;User Equipment (UE) radio access capabilities(Release 16)", 3GPP TS 38.306 V16.0.0 (Mar. 2020), 64 pages.
"3rd Generation Partnership Project; Technical Specification Group Radio Access Network;NR;Radio Resource Control (RRC) protocol specification(Release 16)", 3GPP Ts 38.331 V16.0.0 (Mar. 2020), 835 pages.
Qualcomm et al., "WF on Intra-band Non-contiguous Ulca Tx Architectures and Issues", 3GPP Tsg-Ran WG4 Meeting #94-e, R4-2002812, Electronic Meeting, Feb. 24-Mar. 6, 2020, 9 pages.
"3rd Generation Partnership Project; Technical Specification Group Radio Access Network;Evolved Universal Terrestrial Radio Access (E-UTRA);LTE Advanced Intra-band Non-contiguous Carrier Aggregation in Band 4 Work Item Technical Report(Release 12)", 3GPP TR 36.833 V0.2.0 (Apr. 2013), 9 pages.
3GPP TSG-RAN WG4 Meeting # 94-e-Bis, R4-2005436, "Email discussion summary for [94e Bis][206] NR_IAB_Featurelist", Electronic Meeting, Apr. 20-30, 2020, 19 pages.

* cited by examiner

COMMUNICATION METHOD AND APPARATUS FOR CARRIER AGGREGATION

CROSS-REFERENCE TO RELATED APPLICATIONS

This application is a continuation of International Application No. PCT/CN2021/090168, filed on Apr. 27, 2021, which claims priority to Chinese Patent Application No. 202010352423.5, filed on Apr. 28, 2020. The disclosures of the aforementioned applications are hereby incorporated by reference in their entireties.

TECHNICAL FIELD

The embodiments may relate to the communication field, a communication method, and an apparatus.

BACKGROUND

A carrier aggregation (CA) technology can be used to aggregate a plurality of contiguous or non-contiguous component carriers (CCs) to form a large bandwidth. This increases uplink and downlink transmission rates and meets requirements for increasing a peak rate and a system capacity. In the CA technology, a terminal device may determine, based on a capability of the device, a maximum quantity of carriers that can be used to perform uplink and downlink transmission at the same time.

In intra-band non-contiguous carrier aggregation (NC CA), a terminal device reports a supported non-contiguous CA combination, a capability parameter of the combination, a band used in the combination, a parameter of the band, and a parameter of each CC in the combination, for example, a bandwidth, a subcarrier spacing (SCS), a quantity of multiple-input multiple-output (MIMO) layers, or the like. The quantity of MIMO layers reported in this manner is a corresponding quantity of MIMO layers supported by the terminal device on each CC under an assumption that each radio frequency (RF) channel of the terminal device processes only a wanted signal.

In an existing reporting manner, the terminal device can report only one MIMO layer quantity capability for each CC that is in one CA configuration.

SUMMARY

The embodiments may provide a communication method and apparatus, so that a network device can improve CA resource configuration flexibility.

According to a first aspect, a communication method is provided. The method includes: A terminal device sends a carrier aggregation (CA) capability reporting message to a network device, where the CA capability reporting message includes a frequency separation class of each of at least one radio frequency (RF) channel of the terminal device and a power amplifier (PA) architecture of the terminal device. The PA architecture indicates that the PA architecture that can be used by the terminal device to support CA is a single PA and/or a plurality of PAs.

The terminal device associates the frequency separation class of each RF channel with the PA architecture of the terminal device by reporting a CA capability that includes the frequency separation class of each RF channel and the PA architecture. In this way, the terminal device may notify, based on the frequency separation class and the PA architecture, the network device of all possible CA configurations supported by the terminal device, so that the network device can flexibly and properly configure a CA resource based on a CA capability reported by the terminal device.

In another possible implementation, the frequency separation class includes one frequency separation class value, and the PA architecture that can be used by the terminal device to support the CA and that is indicated by the PA architecture is the single PA.

In another possible implementation, the method further includes: The terminal device receives frequency separation of the CA configured by the network device, where the frequency separation of the CA configured by the network device is determined based on the CA capability reporting message. When the frequency separation of the CA configured by the network device is less than or equal to a maximum value of frequency separation classes of RF channels, the terminal device processes, by using the single PA, the frequency separation of the CA configured by the network device; and when the frequency separation of the CA configured by the network device is greater than the maximum value of the frequency separation classes of the RF channels, the terminal device processes, by using the plurality of PAs, the frequency separation of the CA configured by the network device.

The terminal device may flexibly determine, based on a frequency separation class of a CA configured by the network device and the frequency separation class of each RF channel of the terminal device, whether the terminal device supports the CA by using one PA or the plurality of PAs. This fully utilizes the CA capability of the terminal device.

In another possible implementation, the CA capability reporting message further includes a maximum quantity of multiple-input multiple-output (MIMO) layers, and the maximum quantity of MIMO layers corresponds to the PA architecture.

In another possible implementation, the maximum quantity of MIMO layers includes a corresponding maximum MIMO layer quantity capability when the terminal device supports the CA by using the single PA, and a corresponding maximum MIMO layer quantity capability when the terminal device supports the CA by using the plurality of PAs.

A maximum quantity of MIMO layers when the terminal device supports the CA by using the single PA may be different from a maximum quantity of MIMO layers when the terminal device supports the CA by using the plurality of PAs. By reporting corresponding quantities of MIMO layers in different cases, the network device may perform proper MIMO configuration and scheduling based on the quantities of MIMO layers reported by the terminal device.

In another possible implementation, the CA capability reporting message further includes RF indicator relaxation information, the RF indicator relaxation information indicates whether RF indicator relaxation is required when the terminal device supports the CA by using the single PA, and the RF indicator relaxation includes adjacent channel leakage ratio ACLR indicator relaxation and spectrum emission mask SEM indicator relaxation.

The RF indicator relaxation information further indicates the CA capability of the terminal device. The network device may further determine, based on the RF indicator relaxation information, how to properly configure CA for the terminal device based on capability information. In this way, the CA configuration is more flexible. For example, when the terminal device reports to the network device that the terminal device needs the RF indicator relaxation to support the CA in a current CA combination configuration by using the single PA, the network device may perform scheduling adjustment in terms of a modulation order and the like, to better improve network performance.

According to a second aspect, a communication method is provided. The method includes: A network device receives a carrier aggregation (CA) capability reporting message sent by a terminal device, where the CA capability reporting message includes a frequency separation class of each of at least one radio frequency (RF) channel of the terminal device and a power amplifier (PA) architecture of the terminal device. The PA architecture indicates that the PA architecture that can be used by the terminal device to support CA is a single PA and/or a plurality of Pas.

The network device receives a CA capability that is reported by the terminal device and that includes the frequency separation class of each RF channel and the PA architecture and learns of all possible CA configurations supported by the terminal device, so that the network device can flexibly and properly configure a CA resource based on a CA capability reported by the terminal device.

In another possible implementation, the frequency separation class includes one frequency separation class value, and the PA architecture that can be used by the terminal device to support the CA and that is indicated by the PA architecture is the single PA.

In another possible implementation, the method further includes: The network device determines, based on the CA capability reporting message, frequency separation of the CA configured for the terminal device; and the network device sends the frequency separation of the configured CA to the terminal device. When the frequency separation of the CA configured by the network device is less than or equal to a maximum value of frequency separation classes of RF channels, the terminal device processes, by using the single PA, the frequency separation of the CA configured by the network device; and when frequency separation of a CA configured by the network device is greater than the maximum value of the frequency separation classes of the RF channels, the terminal device processes, by using the plurality of Pas, the frequency separation of the CA configured by the network device.

The terminal device may flexibly determine, based on the frequency separation of the CA configured by the network device and the frequency separation class of each RF channel of the terminal device, whether the terminal device supports the CA by using one PA or the plurality of Pas. This fully utilizes the CA capability of the terminal device.

In another possible implementation, the CA capability reporting message further includes a maximum quantity of multiple-input multiple-output (MIMO) layers, and the maximum quantity of MIMO layers corresponds to the PA architecture.

In another possible implementation, the quantity of MIMO layers includes a corresponding maximum MIMO layer quantity capability when the terminal device supports the CA by using the single PA, and a corresponding maximum MIMO layer quantity capability when the terminal device supports the CA by using the plurality of Pas.

A maximum quantity of MIMO layers when the terminal device supports the CA by using the single PA may be different from a maximum quantity of MIMO layers when the terminal device supports the CA by using the plurality of Pas. By reporting corresponding maximum quantities of MIMO layers in different cases, the network device may perform proper MIMO configuration and scheduling based on the maximum quantities of MIMO layers reported by the terminal device.

In another possible implementation, the CA capability reporting message further includes RF indicator relaxation information, the RF indicator relaxation information indicates whether RF indicator relaxation is required when the terminal device supports the CA by using the single PA, and the RF indicator relaxation includes adjacent channel leakage ratio ACLR indicator relaxation and spectrum emission mask SEM indicator relaxation.

The RF indicator relaxation information further indicates the CA capability of the terminal device. The network device may further determine, based on the RF indicator relaxation information, how to properly configure CA for the terminal device based on capability information reported by the terminal device. In this way, the CA configuration is more flexible. For example, when the terminal device reports to the network device that the terminal device needs the RF indicator relaxation to support the CA in a current CA combination configuration by using the single PA, the network device may perform scheduling adjustment in terms of a modulation order and the like, to better improve network performance.

According to a third aspect, a communication apparatus is provided, where the communication apparatus is applied to a terminal device, and the apparatus includes a sending unit, configured to send a carrier aggregation (CA) capability reporting message to a network device, where the CA capability reporting message includes a frequency separation class of each of at least one radio frequency (RF) channel of the terminal device and a power amplifier (PA) architecture of the terminal device. The PA architecture indicates that the PA architecture that can be used by the terminal device to support CA is a single PA and/or a plurality of PAs.

The terminal device notifies, by reporting a CA capability that includes the frequency separation class of each RF channel and the PA architecture, the network device of all possible CA configurations supported by the terminal device, so that the network device can flexibly and properly configure a CA resource based on a CA capability reported by the terminal device.

In another possible implementation, the frequency separation class includes one frequency separation class value, and the PA architecture that can be used by the terminal device to support the CA and that is indicated by the PA architecture is the single PA.

In another possible implementation, the apparatus further includes a receiving unit, configured to receive frequency separation of the CA configured by the network device, where the frequency separation of the CA configured by the network device is determined based on the CA capability reporting message. When the frequency separation of the CA configured by the network device is less than or equal to a maximum value of frequency separation classes of RF channels, the terminal device processes, by using the single PA, the frequency separation of the CA configured by the network device; and when the frequency separation of the CA configured by the network device is greater than the maximum value of the frequency separation classes of the RF channels, the terminal device processes, by using the plurality of PAs, the frequency separation of the CA configured by the network device.

The terminal device may flexibly determine, based on the frequency separation of the CA configured by the network device and the frequency separation class of each RF channel of the terminal device, whether the terminal device supports the CA by using one PA or the plurality of PAs. This fully utilizes the CA capability of the terminal device.

In another possible implementation, the CA capability reporting message further includes a maximum quantity of multiple-input multiple-output (MIMO) layers, and the maximum quantity of MIMO layers corresponds to the PA architecture.

In another possible implementation, the maximum quantity of MIMO layers includes a corresponding maximum quantity of MIMO layers when the terminal device supports the CA by using the single PA, and a corresponding maximum quantity of MIMO layers when the terminal device supports the CA by using the plurality of PAs.

The maximum quantity of MIMO layers when the terminal device supports the CA by using the single PA may be different from the maximum quantity of MIMO layers when the terminal device supports the CA by using the plurality of PAs. By reporting corresponding maximum quantities of MIMO layers in different cases, the network device may perform proper MIMO scheduling and configuration based on the maximum quantities of MIMO layers reported by the terminal device.

In another possible implementation, the CA capability reporting message further includes RF indicator relaxation information, the RF indicator relaxation information indicates whether RF indicator relaxation is required when the terminal device supports the CA by using the single PA, and the RF indicator relaxation includes adjacent channel leakage ratio ACLR indicator relaxation and spectrum emission mask SEM indicator relaxation.

The RF indicator relaxation information further indicates the CA capability of the terminal device. The network device may further determine, based on the RF indicator relaxation information, how to properly configure CA for the terminal device based on capability information reported by the terminal device. In this way, the CA configuration is more flexible. For example, when the terminal device reports to the network device that the terminal device needs the RF indicator relaxation to support the CA in a current CA combination configuration by using the single PA, the network device may perform scheduling adjustment in terms of a modulation order and the like, to better improve network performance.

According to a fourth aspect, a communication apparatus is provided, where the communication apparatus is applied to a network device, and the apparatus includes a receiving unit, configured to receive a carrier aggregation (CA) capability reporting message sent by a terminal device, where the CA capability reporting message includes a frequency separation class of each of at least one radio frequency (RF) channel of the terminal device and a power amplifier (PA) architecture of the terminal device. The PA architecture indicates that the PA architecture that can be used by the terminal device to support CA is a single PA and/or a plurality of Pas.

The network device receives a CA capability reported by the terminal device and learns of all possible CA configurations supported by the terminal device, so that the network device can flexibly and properly configure a CA resource based on a CA capability reported by the terminal device.

In another possible implementation, the frequency separation class includes one frequency separation class value, and the PA architecture that can be used by the terminal device to support the CA and that is indicated by the PA architecture is the single PA.

In another possible implementation, the apparatus further includes: a determining unit, configured to determine, based on the CA capability reporting message, frequency separation of the CA configured for the terminal device; and a sending unit, configured to send the frequency separation of the configured CA to the terminal device. When the frequency separation of the CA configured by the network device is less than or equal to a maximum value of frequency separation classes of RF channels, the terminal device processes, by using the single PA, the frequency separation of the CA configured by the network device; and when the frequency separation of the CA configured by the network device is greater than the maximum value of the frequency separation classes of the RF channels, the terminal device processes, by using the plurality of Pas, the frequency separation of the CA configured by the network device.

The terminal device may flexibly determine, based on the frequency separation of the CA configured by the network device and the frequency separation class of each RF channel of the terminal device, whether the terminal device supports the CA by using one PA or the plurality of Pas. This fully utilizes the CA capability of the terminal device.

In another possible implementation, the CA capability reporting message further includes a maximum quantity of multiple-input multiple-output (MIMO) layers, and the maximum quantity of MIMO layers corresponds to the PA architecture.

In another possible implementation, the maximum quantity of MIMO layers includes a corresponding maximum quantity of MIMO layers when the terminal device supports the CA by using the single PA, and a corresponding maximum quantity of MIMO layers when the terminal device supports the CA by using the plurality of Pas.

The maximum quantity of MIMO layers when the terminal device supports the CA by using the single PA may be different from the maximum quantity of MIMO layers when the terminal device supports the CA by using the plurality of Pas. By reporting corresponding quantities of MIMO layers in different cases, the network device may perform proper MIMO configuration and scheduling based on the quantities of MIMO layers reported by the terminal device.

In another possible implementation, the CA capability reporting message further includes RF indicator relaxation information, the RF indicator relaxation information indicates whether RF indicator relaxation is required when the terminal device supports the CA by using the single PA, and the RF indicator relaxation includes adjacent channel leakage ratio ACLR indicator relaxation and spectrum emission mask SEM indicator relaxation.

The RF indicator relaxation information further indicates the CA capability of the terminal device. The network device may further determine, based on the RF indicator relaxation information, how to properly configure CA for the terminal device based on capability information reported by the terminal device. In this way, the CA configuration is more flexible. For example, when the terminal device reports to the network device that the terminal device needs the RF indicator relaxation to support the CA in a current CA combination configuration by using the single PA, the network device may perform scheduling adjustment in terms of a modulation order and the like, to better improve network performance.

According to a fifth aspect, a non-transitory computer-readable medium is provided. The non-transitory computer-readable medium stores program code for execution by a device, and the program code includes program code used to perform the communication method according to any one of the first aspect or the implementations of the first aspect.

According to a sixth aspect, a non-transitory computer-readable medium is provided. The non-transitory computer-readable medium stores program code for execution by a device, and the program code includes program code used to perform the communication method according to any one of the second aspect or the implementations of the second aspect.

According to a seventh aspect, a computer program product is provided, where the computer program product includes computer program code, and when the computer program code is run on a computer, the computer is enabled to perform the communication method according to any one of the first aspect or the implementations of the first aspect.

According to an eighth aspect, a computer program product is provided, where the computer program product includes computer program code, and when the computer program code is run on a computer, the computer is enabled to perform the communication method according to any one of the second aspect or the implementations of the second aspect.

According to a ninth aspect, a chip is provided, where the chip includes a processor and a data interface, and the processor reads, through the data interface, instructions stored in a memory, to perform the communication method according to any one of the first aspect or the implementations of the first aspect.

Optionally, in an implementation, the chip may further include the memory. The memory stores the instructions. The processor is configured to execute the instructions stored in the memory. When the instructions are executed, the processor is configured to perform the communication method according to any one of the first aspect or the implementations of the first aspect.

According to a tenth aspect, a chip is provided, where the chip includes a processor and a data interface, and the processor reads, through the data interface, instructions stored in a memory, to perform the communication method according to any one of the second aspect or the implementations of the second aspect.

Optionally, in an implementation, the chip may further include the memory. The memory stores the instructions. The processor is configured to execute the instructions stored in the memory. When the instructions are executed, the processor is configured to perform the communication method according to any one of the second aspect or the implementations of the second aspect.

According to an eleventh aspect, an apparatus is provided, including a processor and a memory, where the memory is configured to store computer program code, and when the computer program code is run on the processor, the apparatus is enabled to perform the communication method according to any one of the first aspect or the implementations of the first aspect.

According to a twelfth aspect, an apparatus is provided, including a processor and a memory, where the memory is configured to store computer program code, and when the computer program code is run on the processor, the apparatus is enabled to perform the communication method according to any one of the second aspect or the implementations of the second aspect.

According to a thirteenth aspect, a communication system is provided, including the communication apparatus according to any one of the third aspect or the implementations of the third aspect and the communication apparatus according to any one of the fourth aspect or the implementations of the fourth aspect, to enable the communication system to implement the communication method according to any one of the first aspect or the implementations of the first aspect and the communication method according to any one of the second aspect or the implementations of the second aspect.

DETAILED DESCRIPTION OF THE EMBODIMENTS

The following clearly describes the embodiments with reference to the accompanying drawings. It is clear that the described embodiments are some, but not all, of the embodiments.

The embodiments may be applied to various communication systems, such as a global system for mobile communications (GSM) system, a code division multiple access (CDMA) system, a wideband code division multiple access (WCDMA) system, a general packet radio service (GPRS) system, a long term evolution (LTE) system, an LTE frequency division duplex (FDD) system, an LTE time division duplex (TDD) system, a universal mobile telecommunications system (UMTS), a worldwide interoperability for microwave access (WiMAX) communication system, a future $5^{th}$ generation (5G) system, or a new radio (NR) system.

Figure 1:
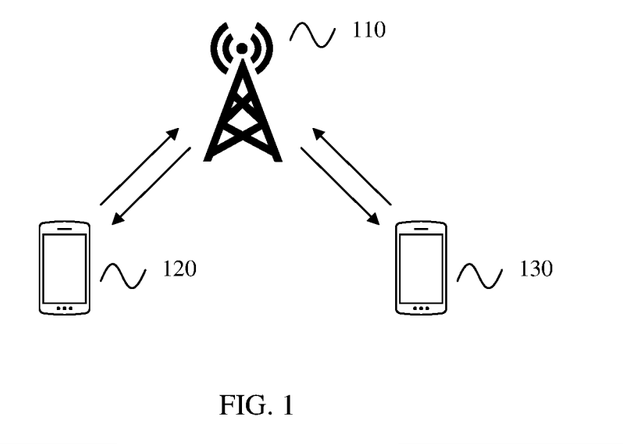
FIG. 1 is a schematic diagram of a communication system according to an embodiment.

For ease of understanding the embodiments, a communication system shown in FIG. 1 is first used as an example to describe in detail a communication system applicable to the embodiments. FIG. 1 is a schematic diagram of the wireless communication system 100 applicable to the embodiments. As shown in FIG. 1, the wireless communication system 100 may include one or more network devices, for example, a network device 110 shown in FIG. 1. The wireless communication system 100 may further include one or more terminal devices, for example, a terminal device 120 and a terminal device 130 shown in FIG. 1.

It should be understood that the network device in the communication system 100 may be any device with a wireless transceiver function or a chip that may be disposed in the device. The device includes, but is not limited to, an evolved NodeB (eNB), a radio network controller (RNC), a NodeB (NB), a base station controller (BSC), a base transceiver station (base transceiver station, BTS), a home evolved NodeB (HNB), a donor eNodeB (DeNB), a baseband unit (BBU), and an access point (AP), a wireless relay node, a wireless backhaul node, a transmission point (TP), a transmission reception point (TRP), and the like in a wireless fidelity (WiFi) system. Alternatively, the device may be a gNB or a transmission point (a TRP or a TP) in a 5G system such as an NR system; may be one antenna panel or a group of antenna panels (including a plurality of antenna panels) of a base station in a 5G system; or may further be a network node such as a baseband unit (BBU) or a distributed unit (DU) that constitutes a gNB or a transmission point.

In some deployments, a gNB may include a centralized unit (CU) and a DU. The gNB may further include a radio frequency unit (RU). The CU implements a part of functions of the gNB, and the DU implements a part of the functions of the gNB. For example, the CU implements functions of a radio resource control (RRC) layer and a packet data convergence protocol (PDCP) layer. The DU implements functions of a radio link control (RLC) layer, a media access control (MAC) layer, and a physical PHY) layer. Information at the RRC layer eventually becomes information at the PHY layer or is converted from the information at the PHY layer. Therefore, in the architecture, higher layer signaling such as RRC layer signaling or PHCP layer signaling may also be considered as being sent by the DU or sent by the DU and the RU. It may be understood that the network device may be a CU node, a DU node, or a device including a CU node and a DU node. In addition, the CU may be classified as a network device in an access network RAN, or the CU may be classified as a network device in a core network CN. This is not limited herein.

It should be further understood that a terminal device in the communication system 100 may also be referred to as user equipment (UE), an access terminal, a subscriber unit, a subscriber station, a mobile station, a remote station, a remote terminal, a mobile device, a user terminal, a terminal, a wireless communication device, a user agent, or a user apparatus. The terminal device in the embodiments may be a mobile phone, a tablet computer (pad), a computer with a wireless transceiver function, a virtual reality (VR) terminal device, an augmented reality (AR) terminal device, a wireless terminal in industrial control, a wireless terminal in self driving, a wireless terminal in telemedicine, a wireless terminal in a smart grid, a wireless terminal in transportation safety, a wireless terminal in a smart city, a wireless terminal in a smart home, or the like. An application scenario is not limited in the embodiments, the foregoing terminal device and the chip that can be disposed in the foregoing terminal device may be collectively referred to as a terminal device.

It should be understood that FIG. 1 shows only an example of the network device 110, the terminal device 120, and the terminal device 130 for ease of understanding. However, this should not constitute any limitation. The wireless communication system may further include more network devices or may include more or fewer terminal devices. Network devices that communicate with different terminal devices may be a same network device or may be different network devices. Quantities of network devices that communicate with different terminal devices may be the same or may be different. This is not limited.

Carrier aggregation (CA) means that two or more component carriers (CC) are aggregated together to support a larger transmission bandwidth. To efficiently utilize fragmented spectrums, the carrier aggregation supports aggregation of different CCs. The carrier aggregation may include intra-band or inter-band CC aggregation. The intra-band CC aggregation may be further classified into intra-band contiguous or non-contiguous CC aggregation, and the like. In a CA technology, a terminal device may determine, based on a capability of the device, a maximum quantity of carriers that can be used to perform uplink and downlink transmission at the same time. A CA reporting method in the embodiments may be applied to reporting, by a terminal device, of a CA capability in intra-band non-contiguous carrier aggregation (NC CA) and inter-band carrier aggregation.

In the system shown in FIG. 1, the terminal device 120 may report, to the network device 110, a CA configuration supported by the terminal device 120, and the network device 110 schedules a CA resource for the terminal device 120 based on the CA configuration reported by the terminal device 120. Alternatively, the terminal device 130 may report, to the network device 110, a CA configuration supported by the terminal device 130, and the network device 110 schedules a CA resource for the terminal device 130 based on the CA configuration reported by the terminal device 130.

The following describes in detail the CA reporting method in the embodiments by using the intra-band non-contiguous carrier aggregation (NC CA) as an example.

Figure 2:
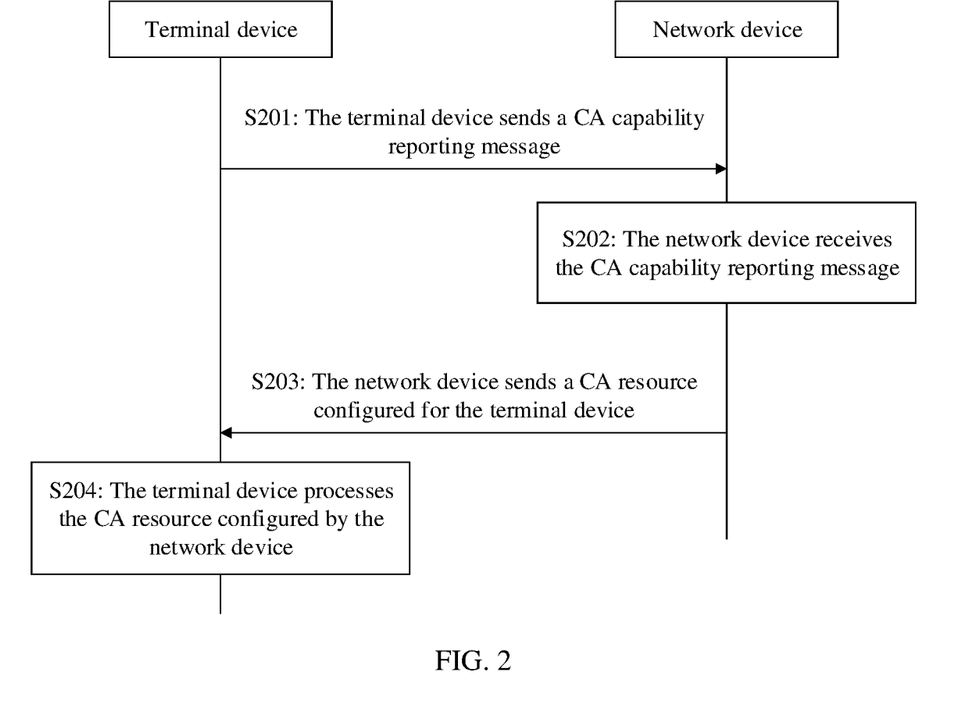
FIG. 2 is a schematic flowchart of a communication method according to an embodiment.

FIG. 2 is a schematic flowchart of a communication method according to an embodiment. As shown in FIG. 2, the communication method in this embodiment includes step S201 to step S204.

S201: A terminal device sends a CA capability reporting message to the network device. The terminal device may report a CA capability supported by the terminal device to the network device, so that the network device can schedule a CA resource for the terminal device.

For example, the CA capability message reported by the terminal device may include a CA combination, a capability parameter of the combination, a band used in the combination, a parameter of the band, and a parameter of each CC in the combination.

S202: The network device receives the CA capability reporting message sent by the terminal device. After receiving the CA capability reporting message sent by the terminal device, the network device may configure, for the terminal device based on the CA capability of the terminal device, a CA resource that can be processed by the terminal device.

S203: The network device sends, to the terminal device, the CA resource configured for the terminal device. For example, the network device may configure frequency separation of the CA for the terminal device, and the network device may further schedule a quantity of multiple-input multiple-output (MIMO) layers for the terminal device.

Figure 3:
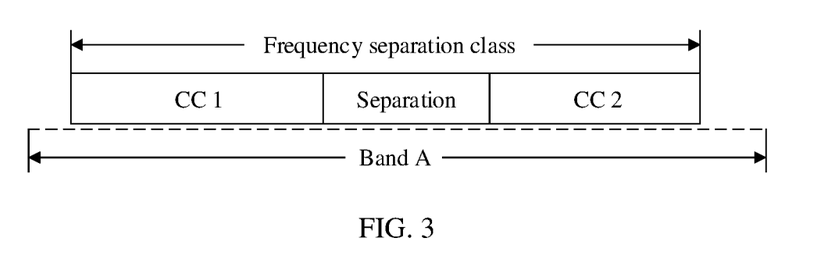
FIG. 3 is a schematic diagram of intra-band non-contiguous carrier aggregation according to an embodiment.
Figure 4:
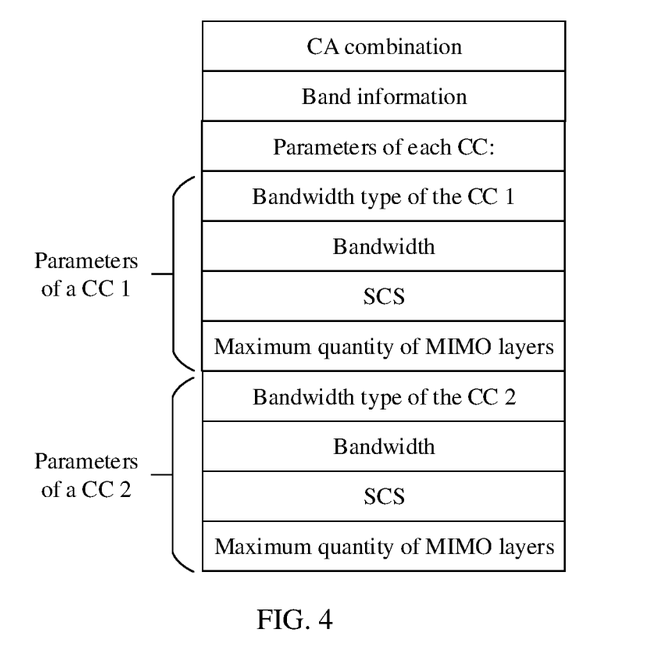
FIG. 4 is a schematic diagram of a method for reporting an intra-band non-contiguous carrier aggregation configuration.
Figure 5:
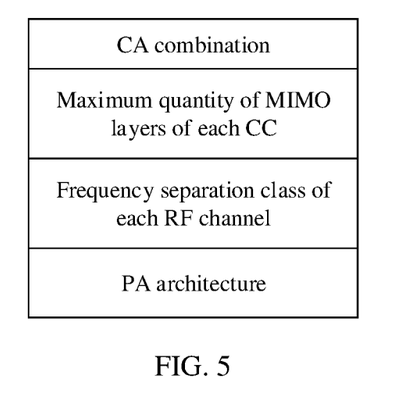
FIG. 5 is a schematic diagram of a method for reporting a carrier aggregation configuration according to an embodiment.

S204: The terminal device processes the CA resource configured by the network device. For example, the terminal device may determine, based on the frequency separation of the CA configured by the network device and a radio frequency channel capability of the terminal device, how to process the CA resource configured by the network device. With reference to FIG. 3 to FIG. 5, the following describes the CA capability reporting message sent by the terminal device to the network device in step S201.

FIG. 3 is a schematic diagram of NC CA. As shown in FIG. 3, a band (band) A includes two non-contiguous CCs: a CC 1 and a CC 2. In existing NC CA reporting, the terminal device reports, to a base station, a supported CA combination, a capability parameter of the combination, a band used in the combination, a parameter of the band, and a parameter of each CC in the combination. FIG. 4 shows content of a CA capability message reported by the terminal device in the existing NC CA reporting. As shown in FIG. 4, parameters of each CC include a bandwidth type of the CC, a bandwidth, a subcarrier spacing (SCS), and a maximum quantity of multiple-input multiple-output (MIMO) layers supported by the terminal device on the CC.

For example, CA combinations supported by the terminal device are the CC 1 and the CC 2, where both of the CC 1 and the CC 2 belong to a band X. In a BandCombination field of a packet, the supported CC combination reported by the terminal de"ice is "Band"+Band X".

In a Bandparameter field of the packet, the terminal device reports a parameter of a band corresponding to each CC. For example, for the CC 1, a class A is reported in a Bandwidthclass field, and the class corresponds to a quantity of contiguous carriers included in the band X corresponding to the CC 1. For example, BandwidthclassA indicates that the band X includes one carrier. A bandwidth that can be supported on the CC 1 is reported in a supportedBandwidthDL or supportedBandwidthUL field. An SCS of the CC 1 is reported in a supportedSubcarrierSpacingDL or supportedSubcarrierSpacingUL field. A maximum quantity of MIMO layers that can be supported by the terminal device on the CC 1 is reported in a maxNumberMIMO-LayerPDSCH or maxNumberMIMO-LayerPUSCH field.

For example, the terminal device supports intra-band non-contiguous carrier aggregation on the band X. The combination of the two CCs (the CC 1 and the CC 2) is used as an example. For the CC 1, a bandwidth of a carrier is 40 MHz, an SCS is 15 kHz, and a maximum quantity of supported MIMO layers is 2. For the CC 2, a bandwidth of a carrier is 50 MHz, an SCS is 30 kHz, and a maximum quantity of supported MIMO layers is 4. In this case, information reported by the terminal device is as follows:

Band X+Band X
Band X{
BandwithclassA
40 MHz
15 kHz
MIMO=2
}
Band X{
BandwithclassA
50 MHz
30 kHz
MIMO=4
}

In addition, the terminal device may further report a frequency separation class (separation class), and the frequency separation class indicates a total bandwidth of all CCs and a gap (gap) between the CCs. As shown in FIG. 3, the frequency separation class indicates a sum of bandwidths, of wanted signals (for example, the CC 1 and the CC 2), that can be supported by the terminal device and a gap bandwidth between non-contiguous CCs.

In the foregoing reporting manner, the quantity of MIMO layers reported by the terminal device is a corresponding quantity of MIMO layers when each radio frequency (radio frequency, RF) channel of the terminal device processes only the wanted signal. In other words, in an existing reporting manner, for one CA combination configuration, the terminal device can report only one corresponding quantity of MIMO layers on each CC, that is, a maximum quantity of MIMO layers that can be supported by each CC under an assumption that the RF channel processes only the wanted signal.

The corresponding quantity of MIMO layers may be different when each RF channel can process a plurality of CCs and a gap between the CCs. For example, the terminal device supports the CA by using two RF channels: an RF 1 and an RF 2, and the terminal device supports the combination of the CC 1 and the CC 2 on the band X. When a bandwidth that can be processed by the RF 1 is greater than frequency separation (frequency separation) between the CC 1 and the CC 2 in a current network configuration, the terminal device may process the CA combination by using the RF 1, and another RF channel other than the RF 1 may be used to support MIMO. When bandwidths that can be processed by the RF 1 and the RF 2 are less than frequency separation (frequency separation) between the CC 1 and the CC 2 in a current network configuration, the terminal device processes the CA combination by using both of the RF 1 and the RF 2, and another RF other than the RF 1 and the RF 2 may be used to support MIMO. In the two cases, the quantity of MIMO layers supported by the terminal device on each CC may be different.

An embodiment may provide a communication method. A terminal device may report, for each CA combination configuration, a frequency separation class supported by each channel and an architecture capability of a transmitter to a network device, so that the network device can properly configure and schedule a CA resource based on CA capability information of the terminal device.

The following describes, with reference to FIG. 5, content of the CA capability reporting message sent by the terminal device to the network device in step S201 in the communication method in this embodiment.

FIG. 5 shows content reported by a terminal device in NC CA according to an embodiment.

As shown in FIG. 5, in some embodiments, in addition to reporting the CA combination supported by the terminal device, the capability parameter of the combination, the band used in the combination, the parameter of the band, and the parameter of each CC in the combination, the terminal device further reports, in the CA combination, a frequency separation class and a power amplifier (PA) architecture that are supported by each RF channel of the terminal device.

A frequency separation class value of each RF channel indicates maximum frequency separation that can be processed by each RF channel.

In a transmitter architecture of the terminal device, each RF channel corresponds to one PA, the PA architecture indicates a capability of supporting CA by the RF channel of the terminal device, and a value of the PA architecture indicates that the PA architecture used by the terminal device to support the CA is a single PA and a plurality of PAs. For example, the following describes in detail an intra-band non-contiguous carrier aggregation reporting method in the embodiments by using an example in which the PA architecture used by the terminal device to support the CA is the single PA and two PAs.

In some embodiments, the terminal device can support CA by using only one RF channel (for example, Tx1). In this case, the terminal device reports a separation class of the one RF channel, and a value of a PA architecture is a single PA (1 PA).

The terminal device notifies, by reporting a CA capability that includes the frequency separation class of each RF channel and the PA architecture, the network device of all possible CA configurations supported by the terminal device, so that the network device can flexibly and properly configure a CA resource based on a CA capability reported by the terminal device.

For example, in an embodiment, frequency separation class of the RF channel and the PA architecture that are reported by the terminal device are as follows: separation class (Tx1)=100 MHz, and PA architecture=1 PA.

In this case, the terminal device can support the CA by using only one RF channel (Tx1), and Tx1 can support only NC CA whose frequency separation is within 100 MHz and that is configured by the network device. In addition, only one maximum quantity of MIMO layers is reported in a parameter of each CC, and the quantity of MIMO layers corresponds to a maximum quantity of MIMO layers when the terminal device supports the CA by using the single PA.

In this case, in step S202 and step S203, after receiving the CA capability reporting message sent by the terminal device, the network device may configure CA with frequency separation not greater than 100 MHz for the terminal device based on the separation class of the RF channel and the PA architecture that are in the message, and the maximum quantity of MIMO layers; and schedule the quantity of MIMO layers based on the maximum quantity of MIMO layers supported by the terminal device.

In some embodiments, the terminal device reports separation classes of two RF channels. In this case, a value of a PA architecture reported by the terminal device "may"e "both", indicating that the PA architecture that can be used by the terminal device to support CA is a single PA and two PAs. In addition, based on a value of frequency separation of CA configured by a network device and a value of a separation class of an RF channel, the terminal device may determine to support a CA configuration of the current network device by using the single PA or the two PAs.

When frequency separation of a CA combination configured by the network device is less than or equal to a maximum value in separation classes of RF channels, the terminal device may support the CA by using the single PA. When the frequency separation of the CA configured by the network device is greater than a maximum value in separation classes of the RF channels, the terminal device supports the CA by using the two PAs, and the terminal device can fully utilize a CA capability.

For example, in an embodiment, the frequency separation class of the RF channel and the PA architecture that are reported by the terminal device are as follows: separation class (Tx1)=100 MHz, separation class (Tx2)=100 MHz, and PA architecture=both.

In this case, the terminal device has two RF channels (Tx1 and Tx2) that may be used to support the CA, and the separation class supported by each channel is 100 MHz. Because the value of the PA architec"ure "s" "both", the terminal device may use one PA to support the CA under some conditions and may use the two PAs to support the CA under other conditions.

For example, the network device sends frequency separation of the configured CA to the terminal device in step S203. When the frequency separation of the CA configured by the network device is less than or equal to 100 MHz, the terminal device determines, in step S204, that one RF channel may be used to support the CA, which is equivalent to PA architecture=1 PA. For example, Tx1 is used to support the CA, and Tx2 is used to support MIMO; or Tx2 is used to support the CA, and Tx1 is used to support the MIMO.

When the frequency separation of the CA configured by the network device is greater than 100 MHz, the frequency separation exceeds a range that can be processed by one channel. Therefore, each CC needs to be processed by using two channels. The terminal device determines, in step S204, to process the CA configured by the network device by using two RF channels, which is equivalent to PA architecture=2 PAs.

In this case, the terminal device supports two CA configurations: one PA and the two PAs. Therefore, when a parameter of each CC is reported, two quantities of MIMO layers are reported, for the two CA configurations, in a field for reporting a maximum quantity of MIMO layers: a maximum quantity of MIMO layers corresponding to a one-PA architecture (MIMO layer for 1 PA) and a maximum quantity of MIMO layers corresponding to a two-PA architecture (MIMO layer for 2 Pas).

In this case, in step S203, when the frequency separation of the CA configured by the network device is less than or equal to 100 MHz, the network device schedules the quantity of MIMO layers of the MIMO layer for one PA for the terminal device; or when the frequency separation of the CA configured by the network device is greater than 100 MHz, the network device schedules the quantity of MIMO layers of the MIMO layer for two Pas for the terminal device.

A maximum quantity of MIMO layers when the terminal device supports the CA by using the single PA may be different from a maximum quantity of MIMO layers when the terminal device supports the CA by using the two Pas. By reporting corresponding quantities of MIMO layers in different cases, the network device may perform proper MIMO configuration and scheduling based on the quantities of MIMO layers reported by the terminal device.

In some embodiments, the two maximum quantities of MIMO layers may be reported in a list form in the field for reporting the maximum quantity of MIMO layers for each CC, for example, MIMO={MIMO layer for 1 PA, MIMO layer for 2 PA}. It should be understood that, in this embodiment, quantities of MIMO layers corresponding to a plurality of CA configurations may be alternatively reported by using another data structure other than the list. This is not limited in this embodiment.

It should be understood that the value of the separation class of each RF channel reported by the terminal device may be different. When the value of the PA architecture is "both", the terminal device may determine, based on the maximum value in the separation classes of the RF channels and a value of a separation class of the CC configured by the network device, whether the terminal device is configured to support the CA by using the single PA or the two Pas.

In some embodiments, when reporting separation classes of two RF channels, the terminal device may alternatively specify the PA architecture as two Pas.

For example, in another embodiment, frequency separation class of the RF channel and the PA architecture that are reported by the terminal device are as follows: separation class (Tx1)=100 MHz, separation class (Tx2)=100 MHz, and PA architecture=2 Pas.

In this case, the terminal device has two RF channels (Tx1 and Tx2) that may be used to support CA. In addition, because a value of the PA architecture is "2 PA", the terminal device needs to support the CA by using the two RF channels. If no additional RF channel can be used to support MIMO, only a maximum quantity of MIMO layers is reported as 1 in a parameter of each CC. In this case, if a quantity of MIMO layers that needs to be supported is more than one, more RF channels are required.

In this case, if no additional RF channel can be used to support the MIMO, a quantity of layers scheduled by the network device to the terminal device in step S203 is 1.

It should be understood that when separation classes of a plurality of RF channels are reported, the separation classes of the channels may be separately reported by using a plurality of channels, the separation classes of the plurality channels may be reported as a list, or the separation classes of the plurality of RF channels may be separately reported on a plurality of contiguous spectrum blocks. This is not limited in this embodiment.

It should be understood that, in some embodiments, each RF channel used to support CA may have a different separation class, and therefore a capability of a maximum quantity of MIMO layers supported on each CC may be different. For example, in the CA configured by the network device, if a bandwidth of a CC 1 is 20 MHz, a bandwidth of a CC 2 is 60 MHz, and a gap between the CC 1 and the CC 2 is 20 MHz, frequency separation of the CA configured by the network device is 100 MHz. For example, frequency separation class of the RF channel reported by the terminal device is as follows: separation class (Tx1)=100 MHz, and separation class (Tx2)=50 MHz.

In this case, the channel Tx1 can process the CC 1, the CC 2, and the gap between the two CCs, and the channel Tx2 can process only the CC 1. In this case, a quantity of MIMO layers of the CC 1 is 2, and a quantity of MIMO layers of the CC 2 is 1.

In this embodiment, an architecture and a capability of a transmitter of the terminal device are considered, and each CA configuration that may be supported by the terminal device and a corresponding quantity of MIMO layers are reported to the network device, so that the network device can properly configure and schedule a CA resource and a quantity of MIMO layers based on CA capability information of the terminal device.

In some embodiments, in addition to reporting the CA combination, the parameter of each CC, the frequency separation class of each RF channel, and the PA architecture, the terminal device may further report RF indicator relaxation information. The indicator relaxation information indicates whether RF indicator relaxation is required when the terminal device supports the CA by using one RF channel (a single-PA architecture). RF indicator relaxation includes adjacent channel leakage ratio (ACLR) indicator relaxation and spectrum emission mask (SEM) indicator relaxation.

A value of the RF indicator relaxation information i"clu"es "Y"s""an""N"". "Yes" indicates that the RF indicator relaxation is requir"d,"and "No" indicates that the RF indicator relaxation is not required.

When the CA capability reporting message sent by the terminal device in step S201 further includes the RF indicator relaxation indication information, the network device may further perform scheduling adjustment in terms of a modulation order and the like in step S203, to improve network performance.

The RF indicator relaxation information further indicates the CA capability of the terminal device. The network device may further determine, based on the RF indicator relaxation information, how to properly configure CA for the terminal device based on the capability information. In this way, the CA configuration is more flexible. For example, when the terminal device reports to the network device that the terminal device needs the RF indicator relaxation to support the CA in a current CA combination configuration by using one PA, the network may perform scheduling adjustment in terms of the modulation order and the like, to better improve the network performance.

After receiving the CA capability reporting message sent by the terminal device, the network device may properly schedule the CA resource and the quantity of MIMO layers based on the CA capability of the terminal device.

The foregoing describes in detail the communication methods in the embodiments with reference to FIG. 1 to FIG. 5. It should be understood that the communication method in the embodiments may also be used in a dual connection (DC) reporting scenario. In the DC reporting scenario, the terminal device and the network device perform operations similar to operations of the terminal device and the network device in the CA reporting method in the embodiments. Details are not described herein again.

The following describes communication apparatuses in the embodiments with reference to FIG. 6 to FIG. 9.

Figure 6:
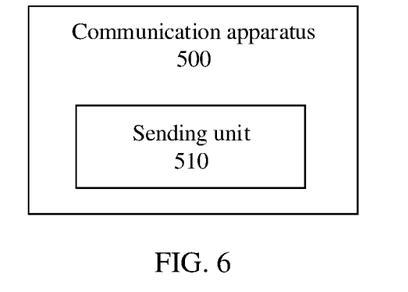
FIG. 6 is a schematic diagram of a structure of a communication apparatus according to an embodiment.

FIG. 6 is a schematic diagram of a structure of a communication apparatus according to an embodiment. As shown in FIG. 6, the communication apparatus 500 includes a sending module 510. The communication apparatus 500 may be applied to the terminal device in the foregoing method. The sending module 510 is configured to send a carrier aggregation (CA) capability reporting message to a network device, where the CA capability reporting message includes a frequency separation class of each of at least one radio frequency (RF) channel of the terminal device and a power amplifier (PA) architecture of the terminal device. The PA architecture indicates that the PA architecture that can be used by the terminal device to support CA is a single PA and/or a plurality of Pas. The terminal device notifies, by reporting a CA capability that includes the frequency separation class of each RF channel and the PA architecture, the network device of all possible CA configurations supported by the terminal device, so that the network device can flexibly and properly configure a CA resource based on a CA capability reported by the terminal device.

In some embodiments, the frequency separation class includes one frequency separation class value, and the PA architecture that can be used by the terminal device to support the CA and that is indicated by the PA architecture is the single PA.

In some other embodiments, the communication apparatus 500 may further include a receiving unit 520, configured to receive frequency separation of the CA configured by the network device. When the frequency separation of the CA configured by the network device is less than or equal to a maximum value of frequency separation classes of RF channels, the terminal device processes, by using the single PA, the frequency separation of the CA configured by the network device; and when the frequency separation of the CA configured by the network device is greater than the maximum value of the frequency separation classes of the RF channels, the terminal device processes, by using the plurality of Pas, the frequency separation of the CA configured by the network device.

The terminal device may flexibly determine, based on the frequency separation of the CA configured by the network device and the frequency separation class of each RF channel of the terminal device, whether the terminal device supports the CA by using one PA or the plurality of Pas. This fully utilizes the CA capability of the terminal device.

In some other embodiments, the CA capability reporting message further includes a maximum quantity of multiple-input multiple-output (MIMO) layers, and the maximum quantity of MIMO layers corresponds to the PA architecture.

In some other embodiments, the maximum quantity of MIMO layers includes a corresponding maximum quantity of MIMO layers when the terminal device supports the CA by using the single PA, and a corresponding maximum quantity of MIMO layers when the terminal device supports the CA by using the plurality of Pas.

The maximum quantity of MIMO layers when the terminal device supports the CA by using the single PA may be different from the maximum quantity of MIMO layers when the terminal device supports the CA by using the plurality of Pas. By reporting corresponding quantities of MIMO layers in different cases, the network device may perform proper MIMO scheduling and configuration based on the quantities of MIMO layers reported by the terminal device.

In some other embodiments, the CA capability reporting message further includes RF indicator relaxation information, the RF indicator relaxation information indicates whether RF indicator relaxation is required when the terminal device supports the CA by using the single PA, and the RF indicator relaxation includes ACLR indicator relaxation and SEM indicator relaxation.

The RF indicator relaxation information further indicates the CA capability of the terminal device. The network device may further determine, based on the RF indicator relaxation information, how to properly configure CA for the terminal device based on capability information reported by the terminal device. In this way, the CA configuration is more flexible.

Figure 7:
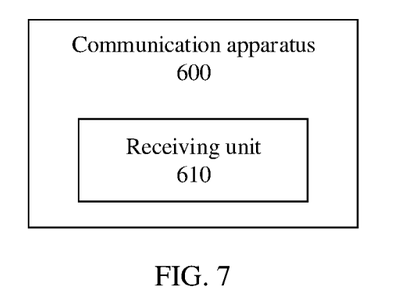
FIG. 7 is a schematic diagram of a structure of a communication apparatus according to another embodiment.

FIG. 7 is a schematic diagram of a structure of a communication apparatus according to another embodiment. As shown in FIG. 7, the communication apparatus 600 includes a receiving unit 610. The communication apparatus 600 may be applied to the network device in the foregoing method. The receiving unit 610 is configured to receive a carrier aggregation (CA) capability reporting message sent by a terminal device, where the CA capability reporting message includes a frequency separation class of each of at least one radio frequency (RF) channel of the terminal device and a power amplifier (PA) architecture of the terminal device. The PA architecture indicates that the PA architecture that can be used by the terminal device to support CA is a single PA and/or a plurality of PAs.

The network device receives a CA capability reported by the terminal device and learns of all possible CA configurations supported by the terminal device, so that the network device can flexibly and properly configure a CA resource based on a CA capability reported by the terminal device.

In some embodiments, the frequency separation class includes one frequency separation class value, and the PA architecture that can be used by the terminal device to support the CA and that is indicated by the PA architecture is the single PA.

In some other embodiments, the communication apparatus 600 may further include a determining unit 620 and a sending unit 630.

The determining unit 620 is configured to determine to send frequency separation of the configured CA to the terminal device.

The sending unit 630 is configured to send the frequency separation of the configured CA to the terminal device. When the frequency separation of the CA configured by the network device is less than or equal to a maximum value of frequency separation classes of RF channels, the terminal device processes, by using the single PA, the frequency separation of the CA configured by the network device; and when the frequency separation of the CA configured by the network device is greater than the maximum value of the frequency separation classes of the RF channels, the terminal device processes, by using the plurality of PAs, the frequency separation of the CA configured by the network device.

The terminal device may flexibly determine, based on a frequency separation class of a CA configured by the network device and the frequency separation class of each RF channel of the terminal device, whether the terminal device supports the CA by using one PA or the plurality of PAs. This fully utilizes the CA capability of the terminal device.

In some other embodiments, the CA capability reporting message further includes a maximum quantity of multiple-input multiple-output (MIMO) layers, and the maximum quantity of MIMO layers corresponds to the PA architecture.

In some other embodiments, the maximum quantity of MIMO layers includes a corresponding maximum quantity of MIMO layers when the terminal device supports the CA by using the single PA, and a corresponding maximum quantity of MIMO layers when the terminal device supports the CA by using the plurality of PAs.

The maximum quantity of MIMO layers when the terminal device supports the CA by using the single PA may be different from the maximum quantity of MIMO layers when the terminal device supports the CA by using the plurality of PAs. By reporting corresponding quantities of MIMO layers in different cases, the network device may perform proper MIMO configuration and scheduling based on the quantities of MIMO layers reported by the terminal device.

In some other embodiments, the CA capability reporting message further includes RF indicator relaxation information, the RF indicator relaxation information indicates whether RF indicator relaxation is required when the terminal device supports the CA by using the single PA, and the RF indicator relaxation includes ACLR indicator relaxation and SEM indicator relaxation.

The RF indicator relaxation information further indicates the CA capability of the terminal device. The network device may further determine, based on the RF indicator relaxation information, how to properly configure CA for the terminal device based on capability information reported by the terminal device. In this way, the CA configuration is more flexible.

Figure 8:
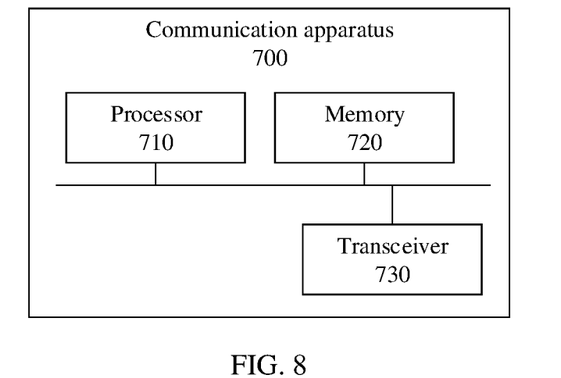
FIG. 8 is a schematic diagram of a structure of a communication apparatus according to another embodiment.

FIG. 8 is a schematic diagram of another communication apparatus 700 according to an embodiment. The communication apparatus 700 may be applied to the terminal device in the foregoing method.

As shown in FIG. 8, the communication apparatus 700 includes a processor 710, a memory 720, and a transceiver 730. The processor 710 may be configured to: control a communication device, execute a software program, process data of the software program, and the like. The memory 720 may be configured to store the software program and the data. The transceiver 730 sends a CA capability reporting message to a network device.

For ease of description, FIG. 8 shows only one memory and one processor. In an actual communication device product, there may be one or more processors and one or more memories. The memory may also be referred to as a storage medium, a storage device, or the like. The memory may be disposed independent of the processor or may be integrated with the processor. This is not limited in the embodiments.

The transceiver may also be referred to as a transceiver unit, a transceiver apparatus, or the like. The processing unit may also be referred to as a processor, a processing board, a processing module, a processing apparatus, or the like. A component that is in the transceiver 730 and that is configured to implement a receiving function may be considered as a receiving unit, and a component that is in the transceiver 730 and that is configured to implement a sending function may be considered as a sending unit. In other words, the transceiver 730 includes the receiving unit and the sending unit. The receiving unit may also be sometimes referred to as a receiver machine, a receiver, a receiver circuit, or the like. The sending unit may also be sometimes referred to as a transmitter machine, a transmitter, a transmitter circuit, or the like.

The processor 710, the memory 720, and the transceiver 730 communicate with each other through an internal connection path, to transfer a control signal and/or a data signal.

The methods in the foregoing embodiments may be applied to the processor 710 or may be implemented by the processor 710. The processor 710 may be an integrated circuit chip and has a signal processing capability. In an implementation process, the steps in the foregoing method may be completed by using an integrated logic circuit of hardware in the processor 710 or instructions in a form of software.

Figure 9:
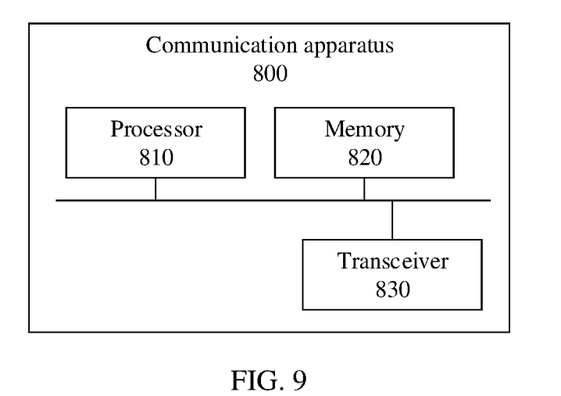
FIG. 9 is a schematic diagram of a structure of a communication apparatus according to another embodiment.

FIG. 9 is a schematic diagram of another communication apparatus 800 according to an embodiment. The communication apparatus 800 may be applied to the terminal device in the foregoing method.

As shown in FIG. 9, the communication apparatus 800 includes a processor 810, a memory 820, and a transceiver 830. The processor 810 may be configured to: control a communication device, execute a software program, process data of the software program, and the like. The memory 820 may be configured to store the software program and the data. The transceiver 830 receives a CA capability reporting message sent by the terminal device.

For ease of description, FIG. 9 shows only one memory and one processor. In an actual communication device product, there may be one or more processors and one or more memories. The memory may also be referred to as a storage medium, a storage device, or the like. The memory may be disposed independent of the processor or may be integrated with the processor. This is not limited in the embodiments.

The transceiver may also be referred to as a transceiver unit, a transceiver apparatus, or the like. The processing unit may also be referred to as a processor, a processing board, a processing module, a processing apparatus, or the like. A component that is in the transceiver 830 and that is configured to implement a receiving function may be considered as a receiving unit, and a component that is in the transceiver 830 and that is configured to implement a sending function may be considered as a sending unit. In other words, the transceiver 830 includes the receiving unit and the sending unit. The receiving unit may also be sometimes referred to as a receiver machine, a receiver, a receiver circuit, or the like. The sending unit may also be sometimes referred to as a transmitter machine, a transmitter, a transmitter circuit, or the like.

The processor 810, the memory 820, and the transceiver 830 communicate with each other through an internal connection path, to transfer a control signal and/or a data signal.

The methods in the foregoing embodiments may be applied to the processor 810 or may be implemented by the processor 810. The processor 810 may be an integrated circuit chip and has a signal processing capability. In an implementation process, the steps in the foregoing method may be completed by using an integrated logic circuit of hardware in the processor 810 or instructions in a form of software.

An embodiment may further provides a non-transitory computer-readable medium. The non-transitory computer-readable medium stores program code. When the computer program code is run on a computer, the computer is enabled to perform the method according to any one of the foregoing aspects. The computer-readable storage includes, but is not limited to, one or more of the following: a read-only memory (ROM), a programmable ROM (PROM), an erasable PROM (EPROM), a flash memory, an electrically EPROM (EEPROM), and a hard disk drive.

An embodiment may further provide a computer program product, applied to a terminal device. The computer program product includes computer program code. When the computer program code is executed by a computer, the computer is enabled to perform the method according to any possible implementation of any one of the foregoing aspects.

An embodiment may further provide a computer program product, applied to a network device. The computer program product includes computer program code. When the computer program code is executed by a computer, the computer is enabled to perform the method according to any possible implementation of any one of the foregoing aspects.

An embodiment may further provide a chip system, applied to a terminal device, and the chip system includes: at least one processor, at least one memory, and an interface circuit. The interface circuit is responsible for information exchange between the chip system and an external environment. The at least one memory, the interface circuit, and the at least one processor are connected to each other through a line. The at least one memory stores instructions. The instructions are executed by the at least one processor, to perform operations of the terminal device in the methods according to the foregoing aspects.

An embodiment may further provide a chip system, applied to a network device, and the chip system includes: at least one processor, at least one memory, and an interface circuit. The interface circuit is responsible for information exchange between the chip system and an external environment. The at least one memory, the interface circuit, and the at least one processor are connected to each other through a line. The at least one memory stores instructions. The instructions are executed by the at least one processor, to perform operations of the network device in the methods according to the foregoing aspects.

In an implementation process, the chip may be implemented in a form of a central processing unit (CPU), a micro controller unit (MCU), a micro processing unit (MPU), a digital signal processor (DSP), a system-on-a-chip (SoC), an application-specific integrated circuit (ASIC), a field programmable gate array (FPGA), or a programmable logic device (PLD).

"At least two" or "a plurality of" means two or more. The term "and/or" describes an association relationship between associated objects and indicates that three relationships may exist. For example, A and/or B may indicate the following cases: only A exists, both A and B exist, and only B exists, where A and B may be singular or plural. The character "/" generally indicates an "or" relationship between the associated objects.

"Predefine" may be understood as "define", "predefine", "store", "pre-store", "pre-negotiate", "pre-configure", "solidify", or "pre-burn".

It should be understood that "one embodiment" or "an embodiment" means that particular features, structures, or characteristics related to embodiments are included in at least one embodiment. Therefore, "in one embodiment" or "in an embodiment" does not necessarily refer to a same embodiment. In addition, these particular features, structures, or characteristics may be combined in one or more embodiments in any appropriate manner. It should be understood that sequence numbers of the foregoing processes do not mean execution sequences in the various embodiments. The execution sequences of the processes should be determined according to functions and internal logic of the processes and should not be construed as any limitation on the implementation processes of the embodiments.

Terms such as "component", "module", and "system" indicate computer-related entities, hardware, firmware, combinations of hardware and software, software, or software being executed. For example, a component may be, but is not limited to, a process that runs on a processor, a processor, an object, an executable file, an execution thread, a program, and/or a computer. As illustrated by using figures, both of a computing device and an application that runs on the computing device may be components. One or more components may reside within a process and/or a thread of execution, and a component may be located on one computer and/or distributed between two or more computers. In addition, the components may be executed from various computer-readable media that store various data structures. For example, the components may communicate by using a local and/or remote process and according to, for example, a signal having one or more data packets (for example, data from two components interacting with another component in a local system, a distributed system, and/or across a network such as the Internet interacting with other systems by using the signal).

It should be understood that sequence numbers of the foregoing processes do not mean execution sequences in the various embodiments. The execution sequences of the processes should be determined according to functions and internal logic of the processes and should not be construed as any limitation on the implementation processes of the embodiments.

A person of ordinary skill in the art may be aware that, in combination with the examples described in the embodiments, units and algorithm steps may be implemented by electronic hardware or a combination of computer software and electronic hardware. Whether functions are performed by hardware or software depends on particular applications and constraint conditions. A person skilled in the art may use different methods to implement the described functions for each particular application, but it should not be considered that the implementation goes beyond the scope of the embodiments.

It may be clearly understood by a person skilled in the art that, for the purpose of convenient and brief description, for a detailed working process of the foregoing system, apparatus, and unit, refer to a corresponding process in the foregoing method embodiment. Details are not described herein again.

In the several embodiments, it should be understood that the systems, apparatuses, and methods may be implemented in other manners. For example, the described apparatus embodiments are merely examples. For example, division into units is merely logical function division and may be other division in an actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on an actual requirement to achieve the objectives of the solutions of embodiments.

In addition, functional units in the embodiments may be integrated into one processing unit, or each of the units may exist alone physically, or two or more units may be integrated into one unit.

When the functions are implemented in a form of a software functional unit and sold or used as an independent product, the functions may be stored in a computer-readable storage medium. Based on such an understanding, the embodiments essentially, or the part contributing to the prior art may be implemented in a form of a software product. The computer software product is stored in a storage medium and includes several instructions for instructing a computer device (which may be a personal computer, a server, or a network device) to perform all or some of the steps of the methods described in the embodiments. The foregoing storage medium includes any medium, for example, a USB flash drive, a removable hard disk, a read-only memory (ROM), a random access memory (RAM), a magnetic disk, an optical disc, or the like that can store program code.

The foregoing description is merely an implementation, but is not intended to limit the scope of the embodiments. Any variation or replacement readily figured out by a person skilled in the art fall within the scope of the embodiments.

What is claimed is:

1. A communication method comprising:
   sending, by a terminal device, a carrier aggregation (CA) capability reporting message to a network device, wherein the CA capability reporting message comprises a frequency separation class of both a radio frequency (RF) channel of the terminal device and a power amplifier (PA) architecture of the terminal device and the PA architecture indicates that the PA architecture configured to be used by the terminal device to support CA is a single PA and/or a plurality of Pas; and
   receiving, by the terminal device, frequency separation of the CA configured by the network device, wherein the frequency separation of the CA configured by the network device is determined based on the CA capability reporting message.

2. The communication method according to claim 1, wherein the frequency separation class comprises one frequency separation class value, and the PA architecture configured to be used by the terminal device to support the CA and that is indicated by the PA architecture is the single PA.

3. The communication method according to claim 1, further comprising:
   when the frequency separation of the CA configured by the network device is less than or equal to a maximum value of frequency separation classes of RF channels, the terminal device processes, by using the single PA, the frequency separation of the CA configured by the network device, and
   when the frequency separation of the CA configured by the network device is greater than the maximum value of the frequency separation classes of the RF channels, the terminal device processes, by using the plurality of PAs, the frequency separation of the CA configured by the network device.

4. The communication method according to claim 1, wherein the CA capability reporting message further comprises a maximum quantity of multiple-input multiple-output (MIMO) layers, the maximum quantity of MIMO layers corresponds to the PA architecture, the maximum quantity of MIMO layers comprises
   a corresponding maximum quantity of MIMO layers when the terminal device supports the CA by using the single PA, and
   a corresponding maximum quantity of MIMO layers when the terminal device supports the CA by using the plurality of PAs.

5. The communication method according to claim 1, wherein the CA capability reporting message further comprises RF indicator relaxation information, the RF indicator relaxation information indicates whether RF indicator relaxation is required when the terminal device supports the CA by using the single PA, and the RF indicator relaxation comprises adjacent channel leakage ratio (ACLR) indicator relaxation and spectrum emission mask (SEM) indicator relaxation.

6. A communication method comprising:
receiving, by a network device, a carrier aggregation (CA) capability reporting message sent by a terminal device, wherein the CA capability reporting message comprises a frequency separation class of both a radio frequency (RF) channel of the terminal device and a power amplifier (PA) architecture of the terminal device, and the PA architecture indicates that the PA architecture configured to be used by the terminal device to support CA is a single PA and/or a plurality of Pas
sending, by the network device to the terminal device, frequency separation of the CA configured by the network device, wherein the frequency separation of the CA configured by the network device is determined based on the CA capability reporting message.

7. The communication method according to claim 6, wherein the frequency separation class comprises one frequency separation class value, and the PA architecture configured to be used by the terminal device to support the CA and that is indicated by the PA architecture is the single PA.

8. The communication method according to claim 6, further comprising:
determining, by the network device based on the CA capability reporting message, the frequency separation of the CA configured for the terminal device.

9. The communication method according to claim 6, wherein the CA capability reporting message further comprises a maximum quantity of multiple-input multiple-output (MIMO) layers, the maximum quantity of MIMO layers corresponds to the PA architecture, the maximum quantity of MIMO layers comprises
a corresponding maximum quantity of MIMO layers when the terminal device supports the CA by using the single PA, and
a corresponding maximum quantity of MIMO layers when the terminal device supports the CA by using the plurality of PAs.

10. The communication method according to claim 6, wherein the CA capability reporting message further comprises RF indicator relaxation information, the RF indicator relaxation information indicates whether RF indicator relaxation is required when the terminal device supports the CA by using the single PA, and the RF indicator relaxation comprises adjacent channel leakage ratio (ACLR) indicator relaxation and spectrum emission mask (SEM) indicator relaxation.

11. A communication apparatus comprising:
at least one processor; and
a memory storing programming instructions for execution by the at least one processor, the programming instructions configuring the apparatus to:
send a carrier aggregation (CA) capability reporting message to a network device, wherein the CA capability reporting message comprises a frequency separation class of both a radio frequency (RF) channel of the communication apparatus and a power amplifier (PA) architecture of the communication apparatus, and the PA architecture indicates that the PA architecture configured to be used by the communication apparatus to support CA is a single PA and/or a plurality of Pas; and
receive frequency separation of the CA configured by the network device, wherein the frequency separation of the CA configured by the network device is determined based on the CA capability reporting message.

12. The communication apparatus according to claim 11, wherein the frequency separation class comprises one frequency separation class value, and the PA architecture configured to be used by the communication apparatus to support the CA and that is indicated by the PA architecture is the single PA.

13. The communication apparatus according to claim 11, wherein the apparatus is further configured to:
when the frequency separation of the CA configured by the network device is less than or equal to a maximum value of frequency separation classes of RF channels, the apparatus processes, by using the single PA, the frequency separation of the CA configured by the network device, and
when the frequency separation of the CA configured by the network device is greater than the maximum value of the frequency separation classes of the RF channels, the apparatus processes, by using the plurality of PAs, the frequency separation of the CA configured by the network device.

14. The communication apparatus according to claim 11, wherein the CA capability reporting message further comprises a maximum quantity of multiple-input multiple-output (MIMO) layers, and the maximum quantity of MIMO layers corresponds to the PA architecture, the maximum quantity of MIMO layers comprises a corresponding maximum quantity of MIMO layers when the communication apparatus supports the CA by using the single PA, and a corresponding maximum quantity of MIMO layers when the communication apparatus supports the CA by using the plurality of PAs.

15. The communication apparatus according to claim 11, wherein the CA capability reporting message further comprises RF indicator relaxation information, the RF indicator relaxation information indicates whether RF indicator relaxation is required when the communication apparatus supports the CA by using the single PA, and the RF indicator relaxation comprises adjacent channel leakage ratio (ACLR) indicator relaxation and spectrum emission mask (SEM) indicator relaxation.

16. A communication apparatus comprising:
at least one processor; and
a memory storing programming instructions for execution by the at least one processor, the programming instructions configuring the communication apparatus to:
receive a carrier aggregation (CA) capability reporting message sent by a terminal device, wherein the CA capability reporting message comprises a frequency separation class of both a radio frequency (RF) channel of the terminal device and a power amplifier (PA) architecture of the terminal device, and the PA architecture indicates that the PA architecture configured to be used by the terminal device to support CA is a single PA and/or a plurality of Pas; and
sending, to a terminal device, frequency separation of the CA configured by the network device, wherein the frequency separation of the CA configured by the network device is determined based on the CA capability reporting message.

17. The communication apparatus according to claim 16, wherein the frequency separation class comprises one frequency separation class value, and the PA architecture configured to be used by the terminal device to support the CA and that is indicated by the PA architecture is the single PA.

18. The communication apparatus according to claim 16, wherein the apparatus is further configured to:
   determine, based on the CA capability reporting message, the frequency separation of the CA configured for the terminal device.

19. The communication apparatus according to claim 16, wherein the CA capability reporting message further comprises a maximum quantity of multiple-input multiple-output (MIMO) layers, the maximum quantity of MIMO layers corresponds to the PA architecture, the maximum quantity of MIMO layers comprises
   a corresponding maximum quantity of MIMO layers when the terminal device supports the CA by using the single PA, and
   a corresponding maximum quantity of MIMO layers when the terminal device supports the CA by using the plurality of PAs.

20. The communication apparatus according to claim 16, wherein the CA capability reporting message further comprises RF indicator relaxation information, the RF indicator relaxation information indicates whether RF indicator relaxation is required when the terminal device supports the CA by using the single PA, and the RF indicator relaxation comprises adjacent channel leakage ratio (ACLR) indicator relaxation and spectrum emission mask (SEM) indicator relaxation.

\* \* \* \* \*